United States Patent [19]

Kahlden

[11] 4,225,817

[45] Sep. 30, 1980

[54] COMBINED CONTINUITY AND VOLTAGE TEST INSTRUMENT

[76] Inventor: Gerald D. Kahlden, Lawton, Okla.

[21] Appl. No.: 949,973

[22] Filed: Oct. 10, 1978

[51] Int. Cl.³ .............................................. G01R 19/14
[52] U.S. Cl. ...................................... 324/133; 324/51; 324/122
[58] Field of Search ................................... 324/51–53, 324/122, 133, 66, 67

[56] References Cited

U.S. PATENT DOCUMENTS

| | | | |
|---|---|---|---|
| 3,416,074 | 12/1968 | Schoonover | 324/133 |
| 3,546,587 | 12/1970 | Turecek | 324/133 |
| 3,614,610 | 10/1971 | Legatti | 324/133 |
| 3,786,468 | 1/1974 | Moffitt | 324/133 |
| 3,831,089 | 8/1974 | Pearce | 324/122 |
| 3,872,384 | 3/1975 | Laass | 324/51 |
| 3,962,630 | 6/1976 | Chaffee | 324/51 |
| 4,015,201 | 3/1977 | Chaffee | 324/51 |
| 4,027,236 | 5/1977 | Stewart | 324/51 |

*Primary Examiner*—Michael J. Tokar
*Attorney, Agent, or Firm*—Hubbard, Thurman, Turner, Tucker & Glaser

[57] ABSTRACT

An electrical testing device comprising two circuit legs connected in parallel to a pair of test probes. The first circuit leg is primarily for indicating continuity and includes a battery in series with a current limiting resister, a diode, and a sounding device across which is connected a zener diode for protection purposes. A second circuit leg includes a resistive voltage divider in series with a zener diode with, in a preferred form, a neon indicator light connected in parallel to all but one of the resisters in the divider network. The functioning of the circuitry as a voltage indicator or a continuity indicator is dependant solely on the nature of the circuit to which the probes are connected.

6 Claims, 2 Drawing Figures

COMBINED CONTINUITY AND VOLTAGE TEST INSTRUMENT

BACKGROUND OF THE INVENTION

This invention relates to continuity and voltage meters and more particularly to a combination tester in which the function of the device is determined by the nature of the circuit to which it is connected.

Prior art believed to be relevant to the present application includes the following U.S. Pat. Nos.: 3,416,074 issued to Schoonover on Dec. 10, 1968; 3,831,089 issued to Pearce on Aug. 20, 1974; 3,872,384 issued to Laass on Mar. 18, 1975; 3,962,630 issued to Chaffee on June 8, 1976; 4,015,201 issued to Chaffee on Mar. 29, 1977; and 4,027,236 issued to Stewart on May 31, 1977. Each of these patents discloses some type of device for measuring voltage in a circuit such as an electrical wiring system in a structure and for checking continuity in such a system. While each of the disclosed devices provides two different functions, they typically require the operation of a mechanical switch in changing from one form of operation to another. In addition, each of the circuits is fairly complicated and involves either solenoid or electronic type relays or solid state amplifiers to perform the various functions. The mechanical moving parts in the switches and solenoids are, of course, subject to failure and the requirement of operating a switch to achieve a particular function always leaves room for error in operating the device. In some cases, failure to switch the device from the continuity test position during a voltage measurement can result in damage to the device.

The above-referenced patents illustrate the usefulness of a device, particularly to commercial electricians, for indicating the voltage present on a given circuit or the state of continuity of the circuit. Such devices are almost essential to the everyday work performed by electrician. It is thefore desirable that such a device be simple, rugged, and reliable.

SUMMARY OF THE INVENTION

Accordingly, an object of the present invention is to provide an improved, and yet simplified combination continuity and voltage tester.

Another object of the present invention is to provide a combined continuity and voltage tester having essentially no moving parts.

Yet another object of the present invention is to provide a continuity and voltage tester the particular function of which is determined by the nature of the circuit to which it is connected.

A combined continuity and voltage tester according to present invention includes a pair of test probes, across which are connected first and second circuit legs. The first circuit leg includes a series combination of a sounding device and a resistive current limiting device. The second circuit leg comprises a number of series connected resistors forming a resistive voltage divider and a plurality of indicating lights, each connected in parallel to one of the resistors in the voltage divider. In a preferred form the first circuit leg also includes a battery and a rectifying diode in series with the other elements, and the second circuit leg includes a regulating diode having a voltage rating higher than the output of the battery in the first leg to prevent battery discharge.

BRIEF DESCRIPTION OF THE DRAWINGS

The present invention may be better understood by reading the following detailed description of the preferred embodiments with reference to the attached drawing wherein.

DESCRIPTION OF THE PREFERRED EMBODIMENTS

Figure 1:
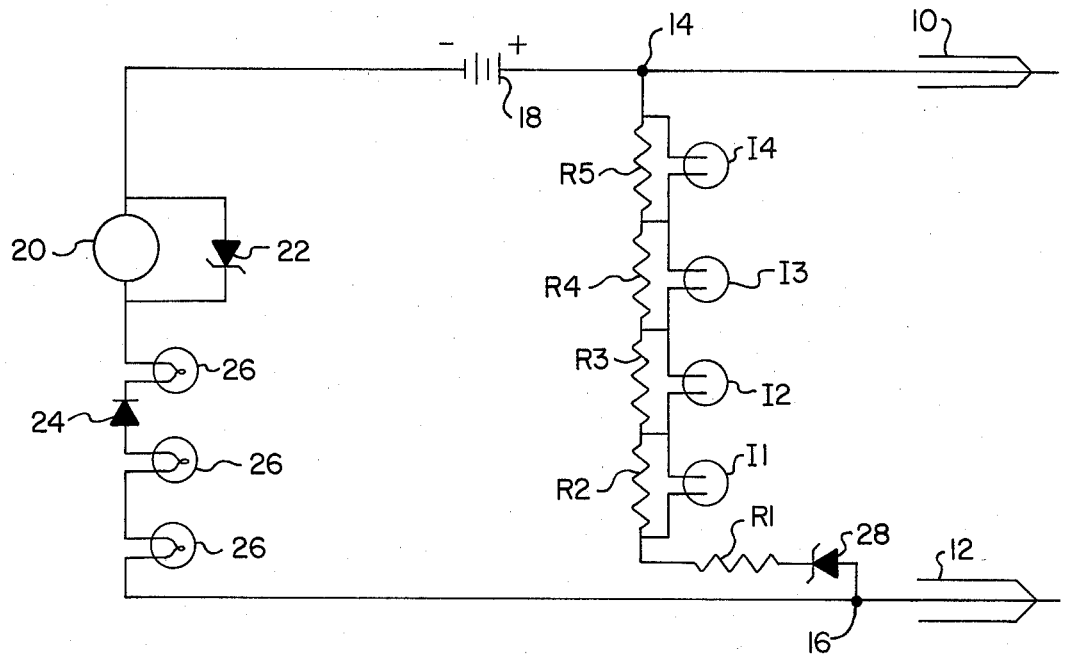
FIG. 1 is a schematic diagram of a preferred form of a combination voltage/continuity tester according to the present invention.

With reference to FIG. 1, there is illustrated a pair of probes 10 and 12, connected to terminals 14 and 16. Terminals 14 and 16 may conveniently be plug-in type connections in a small circuit testing unit to which the probes may be connected. A first circuit leg connected between terminals 14 and 16 includes a battery 18, the parallel combination of a sounding device 20 and a zener diode 22, a rectifying diode 24, and a plurality of lamps 26. The battery 18 in the preferred form is a conventional 9-volt battery commonly used to power transistor radios and other portable equipment. The sounding device 20 is a commercially available product which generates a steady state tone at about 2500 hertz upon application of a DC current. The device used in the preferred embodiment was sold by Mallory, Inc. under the part number SC-628. The zener or regulating diode 22, connected in parallel with sounding device 20, is selected so that the maximum voltage which may appear across device 20 is within the operating specifications of the device. In the preferred embodiment diode 22 is a zener diode having the part number ECG-5138. The rectifying diode 24 insures that current will flow through the sounding device and battery 18 in only one direction. This diode 24 provides a polarity indicating function in this first circuit leg during voltage measurement which allows AC to be distinguished from DC and the polarity of DC to be determined. In the preferred embodiment diode 24 has the part number of ECG-1004. The incandescent bulbs 26 are used as resistive current limiters to dissipate the large amount of power which would otherwise be applied to the sounding device 20 when the probes 10 and 12 are connected to a high voltage power source. In the preferred embodiment bulbs 26 have the part number 120PS. Other power resistors could be used in place of lamps 26 if desired.

A second circuit leg connected between terminals 14 and 16 includes a series string of resistors numbered R1 through R5 which is in series with a regulating diode 28. In the preferred embodiment resistors R1 through R5 have the following values in thousands of ohms respectively: 220, 56, 110, 220, 1000. Each of the resistors R2 through R5 has a neon indicator lamp, I1 through I4 respectively connected in parallel. In the preferred embodiment lamps I1 through I4 have the part number NE-2. With the resistor values employed in the preferred embodiment, the indicator lamps provide a visual indication of the range of voltage applied between probes 10 and 12. When I4 is turned on, this indicates a nominal voltage of 110 volts. When both I4 and I3 are lit, a nominal 220 volts is indicated. When I4, I3, and I2 are lit, a nominal 277 volts is indicated. When all of the indicator lamps are turned on a nominal 480 volts is indicated. It is apparent that other resistive divider networks could be employed to provide similar voltage indications. It is apparent also, that other types of indicator lights such as light emitting diodes could be used in place of the neon bulbs if the resistor divider network were appropriately modified. The voltage indications provided by such a network are only approximate, which is suitable for most purposes, since only a few voltage levels are generally encountered.

The regulating diode 28, in the second circuit leg, is selected to have a voltage higher than that provided by battery 18. In the preferred embodiment diode 28 is a zener diode having the part number ECG-5024. Thus when battery 18 provides a 9-volt output, the regulating voltage of diode 28 may be selected, for example, to be 12 volts. By such a selection, it can be seen that the diode 28 allows essentially no current flow in the current loop comprising the parallel combination of the first and second circuit legs. In practice it has been found that the current drain is so small that the lifetime of battery 18, when connected as shown, is essentially the shelf life of the battery.

In operation the circuit of FIG. 1 can perform either continuity or voltage tests. If the continuity of a circuit is being tested, probes 10 and 12 are connected to the opposite sides of the circuit. If the circuit is continuous, it thereby completes the circuit between battery 18 and sounding device 20, allowing current to flow through the sounding device, which then provides a steady, audible tone as an indication of a continuous or short circuit. If the circuit being tested for continuity was actually a live or hot circuit, no damage is done to the circuity, since the voltage measuring function is performed in exactly the same manner. That is, to measure voltage across a circuit, the probes 10 and 12 are connected across that circuit. The voltage being measured, is thereby connected across both the first and second circuit legs. The second leg responds to the applied voltage, either AC or DC, by causing the appropriate indicator lights I1 through I4 to turn on, and thereby indicate the range of voltage being detected. Since the normal voltages being measured, such as 110 volts AC, are considerably higher than the regulating voltage of diode 28, the diode has essentially no effect on the measured voltage. The neon bulbs of the preferred embodiment are particularly suited for such high voltage operations, since they turn on at the 90-volt range and operate with either polarity of voltage.

When voltage is being measured, the voltage applied to probes 10 and 12 is also, of course, applied across the first circuit leg, having sounding device 20 in it. The battery 18 has a low voltage relative to the normal voltage levels encountered by electricians and does not interfere with the voltage detection function of the first circuit leg. The diode 24 rectifies the current, so that if an AC voltage is applied, only ½ of each cycle of current passes through the sounding device 20. As a result, sounding device 20 responds to the application of an AC voltage by the generation of a modulated tone. On the other hand, if a DC voltage is being measured, the sounding device 20 will not be modulated, but will respond only if the positive side of the voltage is applied to probe 12. In this manner, the device may be used to indicate polarity as well as nominal range of a DC voltage.

The present invention may also be used to detect polarity of various rectifier devices. Probe 10 or terminal 14 may be conveniently marked to indicate that it is the positive output from battery 18, so that proper operation and current flow direction through a rectifying device may be detected. Thus, when a diode is connected between probes 10 and 12, in the proper current flow direction, sounding device 20 will operate continuously and when the reverse connection is made to the diode, sounding device 20 will not. If connection of a diode between probes 10 and 12 in both directions causes the device 20 to sound, this of course indicates that the rectifier device has been shorted and is no longer operative.

The present invention in its continuity function also allows checking of capacitors for leakage because of its high sensitivity (approx. 40K ohms). When probes 10 and 12 are connected across a good capacitor, charging current causes sounding device 20 to momentarily emit sound which dies off and stops when the capacitor is fully charged to battery 18 voltage. If a capacitor has an internal short it will continue to draw current and device 20 will continue to emit sound.

Thus it can be seen that the present device, while being much simpler than the prior known devices, operates as either a continuity or voltage tester dependant only upon the nature of the device being tested. Since the device is designed to withstand the maximum voltage to be encountered, it is essentially burnout proof.

Figure 2:
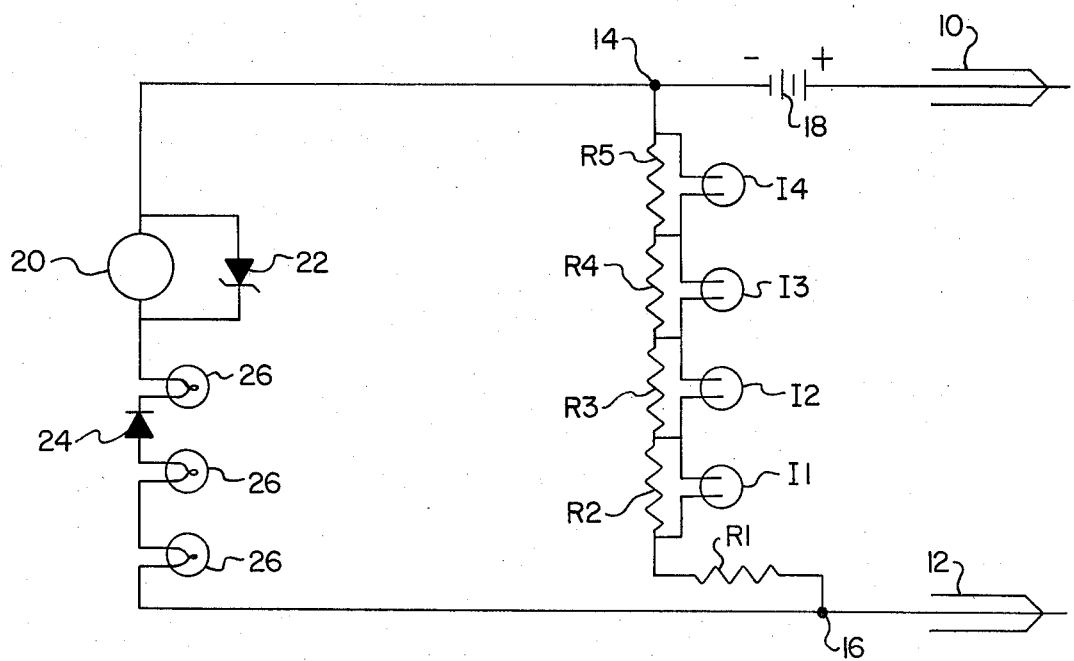
FIG. 2 is a schematic diagram of a second embodiment of the present invention.

With reference now to FIG. 2, there is illustrated a slightly modified version of the present invention, in which essentially all the parts carry the same designation numbers and perform the same functions. The primary change in the FIG. 2 embodiment is that battery 18 has been removed from the first circuit leg and placed between junction 14 and probe 10. In addition, the regulating diode 28 has been removed from the second leg of the circuit. By this modification, it can be seen that the battery voltage is not applied to any of the circuitry until the probes 10 and 12 are connected to an external device to be tested. For this reason the regulating diode 28 is not needed to limit current drain and prolong battery life.

The operation of the FIG. 2 embodiment is essentially identical to the FIG. 1 embodiment. When continuity is being tested by connecting probes 10 and 12 across an external device, battery voltage is applied across both circuit legs to activate the sounding device 20 to indicate continuity. The application of the voltage across the second circuit leg during the testing will cause a small amount of unnecessary current leakage, but since this occurs only during the short time interval of the continuity test, it is insignificant and can be ignored. When voltage is being measured, the small DC voltage of battery 18 has essentially no effect on the indicator lights 11 through 14 and, in fact, acts very much like the diode 28 did in the FIG. 1 embodiment. The battery 18 is still in series with the first circuit leg and again has essentially no effect when voltage is being measured, since the typical voltages are much higher than the battery voltage.

While the present invention has been shown and illustrated in terms of specific apparatus, it is apparent that other modifications and changes can be made within the scope of the present invention as defined by the appended claims.

I claim:
1. Combined continuity testing and voltage indicating apparatus comprising:
first and second terminals adapted for connection to test probes, a first circuit leg coupled between said first and second terminals, said first leg including a sounding device connected in series with a current limiting resistance, and a second circuit leg coupled between said first and second terminals, said second leg including a series connected resistor divider network, and a plurality of indicator lamps connected across resistors in said divider network.

2. Apparatus according to claim 1 wherein said first leg further includes a battery having a preselected voltage connected in series with said sounding device and said resistance, and said second leg further includes a voltage regulating diode having a voltage rating higher than said preselected voltage connected in series with said resistor divider network.

3. Apparatus according to claim 2 wherein said first leg further includes a protective regulating diode connected in parallel with said sounding device, and a rectifying diode connected in series with said sounding device, said battery, and said resistance.

4. Apparatus according to claim 1 wherein said resistance comprises one or more incandescent lamps.

5. Apparatus according to claim 1 further including a third terminal adapted for connection to a test probe, and a battery connected between said first and third terminals.

6. Apparatus according to claim 5 wherein said first leg further includes a protective regulating diode connected in parallel with said sounding device, and a rectifying diode connected in series with said sounding device and said resistance.

* * * * *